United States Patent
Liu et al.

(10) Patent No.: US 9,502,302 B2
(45) Date of Patent: Nov. 22, 2016

(54) PROCESS FOR INTEGRATED CIRCUIT FABRICATION INCLUDING A UNIFORM DEPTH TUNGSTEN RECESS TECHNIQUE

(71) Applicants: STMicroelectronics, Inc., Coppell, TX (US); GlobalFoundries Inc, Grand Cayman (KY); International Business Machines Corporation, Armonk, NY (US)

(72) Inventors: Qing Liu, Watervliet, NY (US); Ruilong Xie, Schenectady, NY (US); Chun-Chen Yeh, Clifton Park, NY (US)

(73) Assignees: STMicroelectronics, Inc., Coppell, TX (US); GlobalFoundries Inc, Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/512,700

(22) Filed: Oct. 13, 2014

(65) Prior Publication Data
US 2016/0104644 A1    Apr. 14, 2016

(51) Int. Cl.
*H01L 21/8234* (2006.01)
*H01L 29/423* (2006.01)

(52) U.S. Cl.
CPC ... *H01L 21/82345* (2013.01); *H01L 29/42372* (2013.01)

(58) Field of Classification Search
CPC .......... H01L 21/82345; H01L 27/088; H01L 29/42372
See application file for complete search history.

(56) References Cited

U.S. PATENT DOCUMENTS

| | | | |
|---|---|---|---|
| 9,178,056 B2 * | 11/2015 | Takaishi | H01L 29/7813 |
| 2013/0020630 A1 * | 1/2013 | Lee | H01L 21/823842 257/324 |
| 2013/0134507 A1 * | 5/2013 | Takaishi | H01L 29/7827 257/334 |
| 2014/0239407 A1 | 8/2014 | Manabe et al. | |
| 2015/0084122 A1 * | 3/2015 | Takaishi | H01L 29/66666 257/330 |

\* cited by examiner

*Primary Examiner* — Michelle Mandala
(74) *Attorney, Agent, or Firm* — Gardere Wynne Sewell LLP

(57) ABSTRACT

Dummy gates are removed from a pre-metal layer to produce a first opening (with a first length) and a second opening (with a second length longer than the first length). Work function metal for a metal gate electrode is provided in the first and second openings. Tungsten is deposited to fill the first opening and conformally line the second opening, thus leaving a third opening. The thickness of the tungsten layer substantially equals the length of the first opening. The third opening is filled with an insulating material. The tungsten is then recessed in both the first and second openings using a dry etch to substantially a same depth from a top surface of the pre-metal layer to complete the metal gate electrode. Openings left following the recess operation are then filled with a dielectric material forming a cap on the gate stack which includes the metal gate electrode.

35 Claims, 6 Drawing Sheets

PROCESS FOR INTEGRATED CIRCUIT FABRICATION INCLUDING A UNIFORM DEPTH TUNGSTEN RECESS TECHNIQUE

TECHNICAL FIELD

The present invention relates to the fabrication of integrated circuits and, more particularly, to a process technique for recessing tungsten with a substantially uniform recess depth for transistors having different channel (gate) lengths.

BACKGROUND

It is common in integrated circuit fabrication to require the formation of MOSFET transistor devices having different channel lengths. As is known to those skilled in the art, transistors of different lengths will have metal gate stacks of corresponding different lengths as well. After provision of the work function metal (WFM) for each metal gate stack, a deposit may be made of an overlying metal, such as tungsten, to form the gate electrode. A process step for recessing (i.e., partially removing) the deposited tungsten for each gate stack is then performed. However, it has proven to be difficult to achieve a uniform recess depth across the transistors of different lengths. The reasons for this include: a) etch loading effect; and b) differences in the tungsten materials for the transistors of different channel length (for example, differences in percent of barrier metal, differences in nucleation layer and differences in size of the tungsten grain boundary).

One solution which addresses the issue of achieving uniform recess depth is to implement a patterning mask to protect the devices having relatively longer channel (gate) lengths during the recess process. This solution, however, incurs an additional patterning cost and additional ash steps. There may also result in an adverse impact on the gate stack from performance of these processes.

There is accordingly a need in the art for a process technique that achieves a substantially uniform recess depth when recessing overlying metal, such as tungsten, in metal gate stacks for transistor devices have different channel (gate) lengths.

SUMMARY

In an embodiment, a process comprises: removing dummy gates from a pre-metal layer formed over a substrate to produce a first opening having a first length over a first channel region and produce a second opening having a second length longer than the first length over a second channel region; depositing work function metal at a bottom of each of the first and second openings; depositing an overlying metal layer on said pre-metal layer that substantially completely fills the first opening and lines the second opening leaving a third opening; depositing an insulating material in the third opening; and recessing the overlying metal layer to substantially a same depth from a top surface of said pre-metal layer in each of the first and second openings.

In an embodiment, a process comprises: removing dummy gates from a pre-metal layer formed over a substrate to produce a first opening having a first length over a first channel region and produce a second opening having a second length longer than the first length over a second channel region; depositing work function metal at a bottom of each of the first and second openings; depositing a tungsten layer having a thickness on said pre-metal layer that substantially equals the first length, said tungsten layer substantially completely filing the first opening and forming a tungsten liner in the second opening having a thickness that substantially equals to the first length and leaving a third opening; depositing an insulating material in the third opening; and performing an operation to remove tungsten from both the first and second openings to substantially a same depth from a top surface of said pre-metal layer.

In an embodiment, an integrated circuit comprises: a substrate including a first region and a second region; a pre-metal layer over the substrate, the pre-metal layer having a top planar surface and including a first gate stack opening having a first length and a second gate stack opening having a second length longer than the first length; a gate oxide region at a bottom of each of the first and second gate stack openings; a work force metal region in each of the first and second gate stack openings; and an overlying metal region in each of the first and second gate stack openings, wherein an upper surface of the overlying metal regions in both the first and second gate stack openings is recessed from said top planar surface by substantially a same distance.

BRIEF DESCRIPTION OF THE DRAWINGS

For a better understanding of the embodiments, reference will now be made by way of example only to the accompanying figures in which:

FIGS. 1-3 and 6-8 show process steps in accordance with another embodiment;

FIGS. 1-4 and 9-11 show process steps in accordance with another embodiment; and FIGS. 1-4, 9-10 and 12 show process steps in accordance with another embodiment.

DETAILED DESCRIPTION OF THE DRAWINGS

Figure 1:
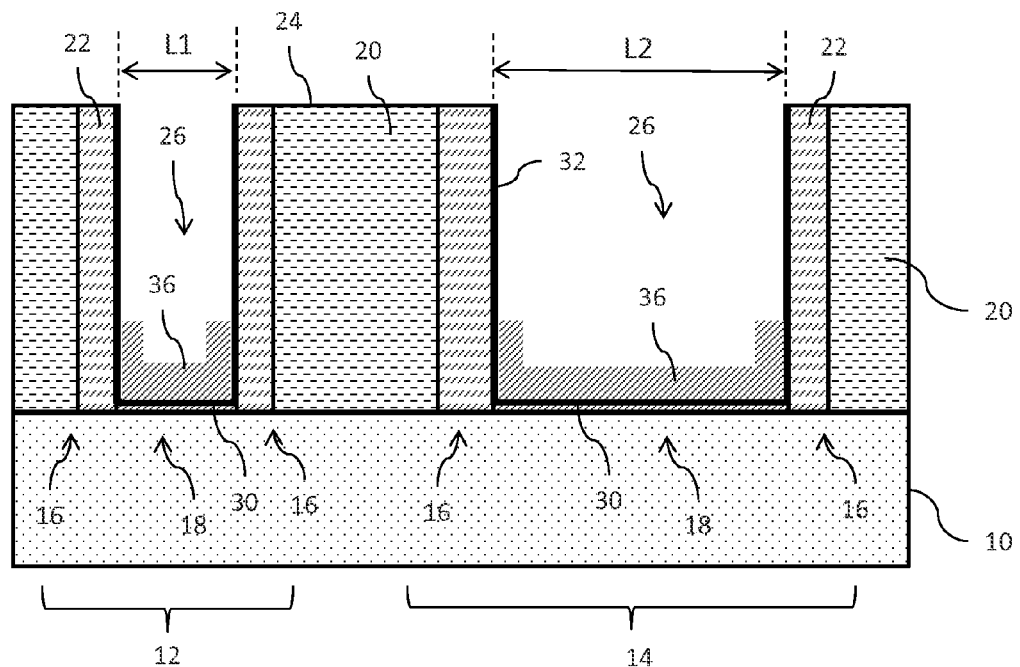
FIGS. 1-5 show process steps in accordance with an embodiment.

Reference is now made to FIGS. 1-5 showing process steps for fabricating an integrated circuit.

The integrated circuit includes a substrate 10. The substrate 10 may comprise, for example, a bulk semiconductor substrate or a silicon-on-insulator (SOI) substrate as known in the art. The substrate is divided into active regions including a region 12 which includes transistors having a first channel length and a region 14 which includes transistors having a second channel length, wherein the first channel length is less than the second channel length. Separation of active regions from each other, for example in the context of forming CMOS devices, is accomplished through the use of isolation regions, for example of the shallow trench isolation (STI) type, which are not explicitly shown in the drawings. The substrate 10 is doped, as needed and known to those skilled in the art, to form source and drain regions 16 on either side of a channel region 18 for each transistor.

The process disclosed herein is implemented in connection with the gate-last fabrication techniques, known to those skilled in the art, that are utilized to form metal gate electrodes. Thus, FIG. 1 shows the wafer at an intermediate front end of line (FEOL) stage where integrated structures have previously been formed. The previously formed structures include a dielectric insulating layer 20 and sidewall spacers 22 which were formed around a dummy gate structure. The layer 20 may, for example, comprise silicon dioxide ($SiO_2$). The sidewall spacers 22 may comprise, for example, one or more of silicon nitride (SiN), silicon borocarbonitride (SiCBN), or silicon oxycarbonitride (SiOCN). The dielectric insulating layer 20 and sidewall spacers 22 have a planar top surface 24. The layer 20 (with included spacers 22) formed above the substrate top surface comprises a pre-metal dielectric layer.

In the gate-last fabrication process, a dummy (for example, polysilicon) gate structure is previously formed between the spacers 22 (and over the channel region 18). That dummy gate structure is then removed to leave a gate stack opening 26. In this configuration, the opening 26 in the first region 12 has a length L1 (generally corresponding to the first channel (gate) length) and the opening 26 in the second region 14 has a length L2 (generally corresponding the second channel (gate) length). The openings 26 are then each subsequently filled with a gate stack for forming a metal gate electrode.

A gate dielectric layer 30 is provided at the bottom of each stack opening 26. The gate dielectric layer 30 may, for example, be formed of a high-k (HK) dielectric material such as hafnium oxide ($HfO_2$), and have a thickness of 1-2 nm. An atomic layer deposition (ALD) process may, for example, be used to form the layer 30.

The opening 26 is further lined with a liner 32 which functions as one or more of a barrier and/or seed layer. The liner 32 may, for example, comprise titanium nitride (TiN), and have a thickness of 1-2 nm. The liner 32 is typically a conformal layer formed using an atomic layer deposition or vapor deposition process.

A work function metal (WFM) layer 36 is also provided in the opening 26. The work function metal layer 36 may, for example, be formed of TiN or titanium carbide (TiC), and have a thickness of 3-6 nm. The layer 36 is typically a conformal layer using any suitable deposition process including atomic layer deposition or vapor deposition.

It will be recognized that the liner 32 and layer 36 may be deposited on the top surface 24 of the dielectric insulating layer 20 and sidewall spacers 22. Prior to further processing, portions of the liner 32 and layer 36 may be removed from the top surface 24.

Additionally, the work function metal layer 36 is recessed from the upper portion of the sidewalls of the opening 26. This recess operation is performed, for example, to leave additional volume in the opening 26 for the subsequent deposition of other metal materials, such as a tungsten material, which minimize gate resistance. The recessing of the work function metal layer 36 further may enhance the process for subsequent metal deposition in the opening 26 by making the deposition easier and cleaner.

Figure 2:
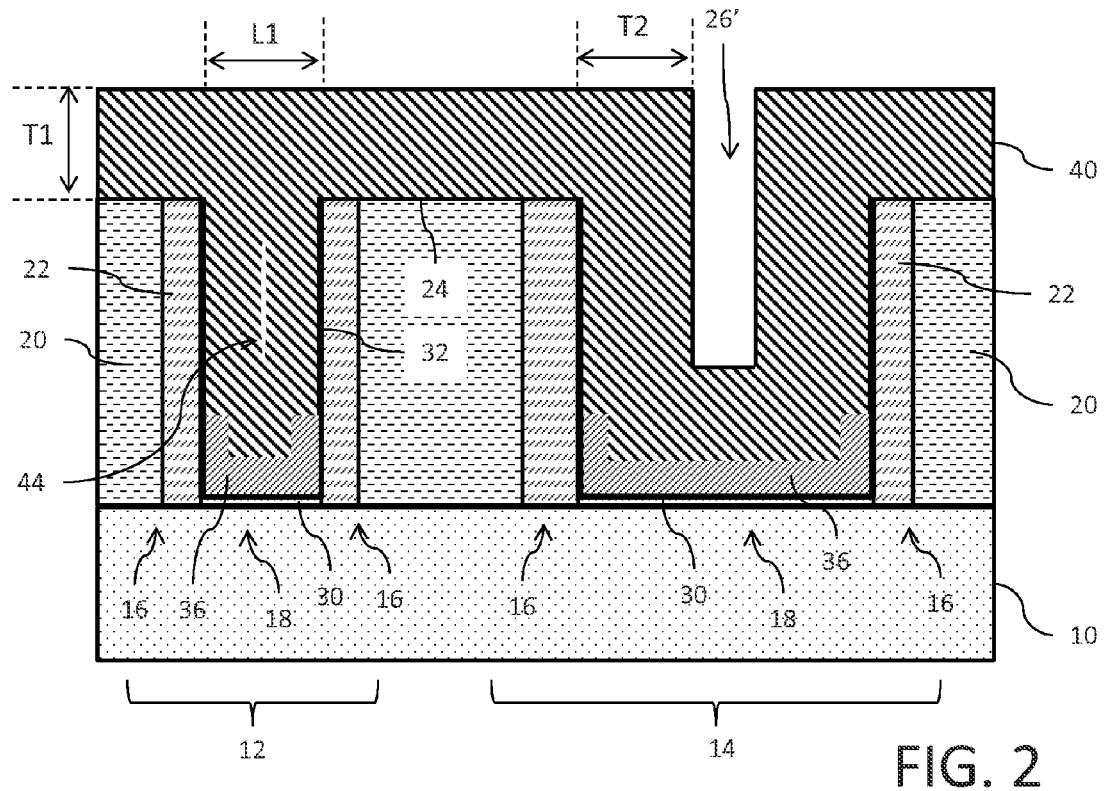

Reference is now made to FIG. 2. A deposition process is then used to form a deposit 40 of an overlying metal layer, for example, made of tungsten. A chemical vapor deposition (CVD) process is, for example, used to form the tungsten deposit 40. The deposit 40 substantially completely fills the relatively smaller opening 26 in the region 12 for the transistors with first channel lengths but does not completely fill, and in fact is a conformal deposit, for the relatively larger opening 26 in the region 14 for the transistors with second channel lengths. The deposit 40 further covers the top surface 24. The thickness T1 of the tungsten deposit is preferably equal to or greater than the first length L1 of the relatively smaller opening 26 in the region 12. With such a thickness T1, the thickness T2 of conformal portion of the deposit 40 lining the opening 26 in the region 14 will be approximately equal to the first length L1 (i.e., T2≈L1). The deposit thickness T1 and the conformal nature of the deposit 40 in the region 14 will leave an opening 26' in the region 14.

The deposit 40 may, for example, comprise an initial deposit of a barrier layer followed by a tungsten deposition having substantially the thickness T1. The barrier layer may, for example, comprise a thin (approximately 3 nm) layer of titanium nitride (TiN) deposited using an atomic layer deposition (ALD) technique. Alternatively, the barrier layer may comprise a thin (approximately 2-3 nm) layer of fluorine-free tungsten deposited using chemical vapor deposition (CVD).

Depending on the aspect ratio of the opening 26 in the region 12, it is possible that the deposit 40 will not completely fill that opening 26. FIG. 2 accordingly shows the presence of a void 44.

Figure 3:
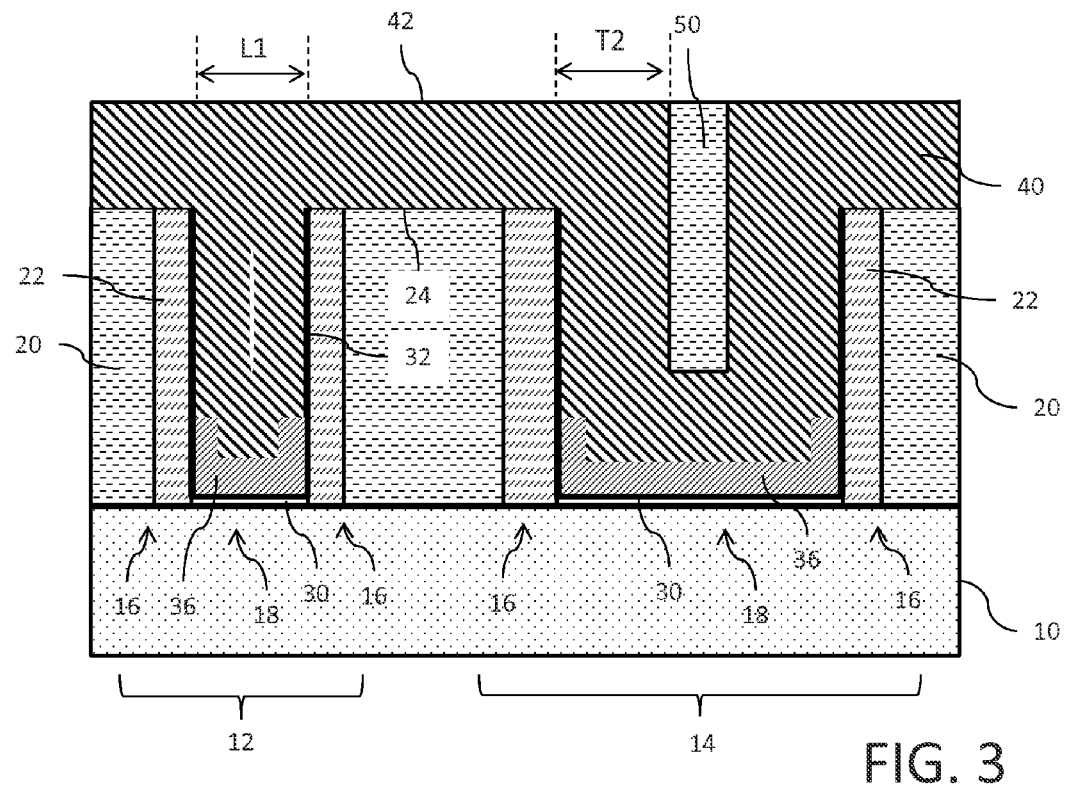

Reference is now made to FIG. 3. The opening 26' in the region 14 is then filled with an oxide material 50. For example, a CVD or ALD process may be used. Alternatively, a flowable oxide process may be used. In an embodiment, the oxide material 50 may, for example, comprise an suitable flowable oxide (silicon oxide film) or ALD conformal oxide. The filling of the opening 26' may result in material 50 deposited on top of the tungsten deposit 40. A process to remove the excess material and planarize the top surface 42 of the deposit 40 (co-planar with oxide material 50) is performed. This process may comprise, for example, a chemical-mechanical polishing (CMP) operation.

Figure 4:
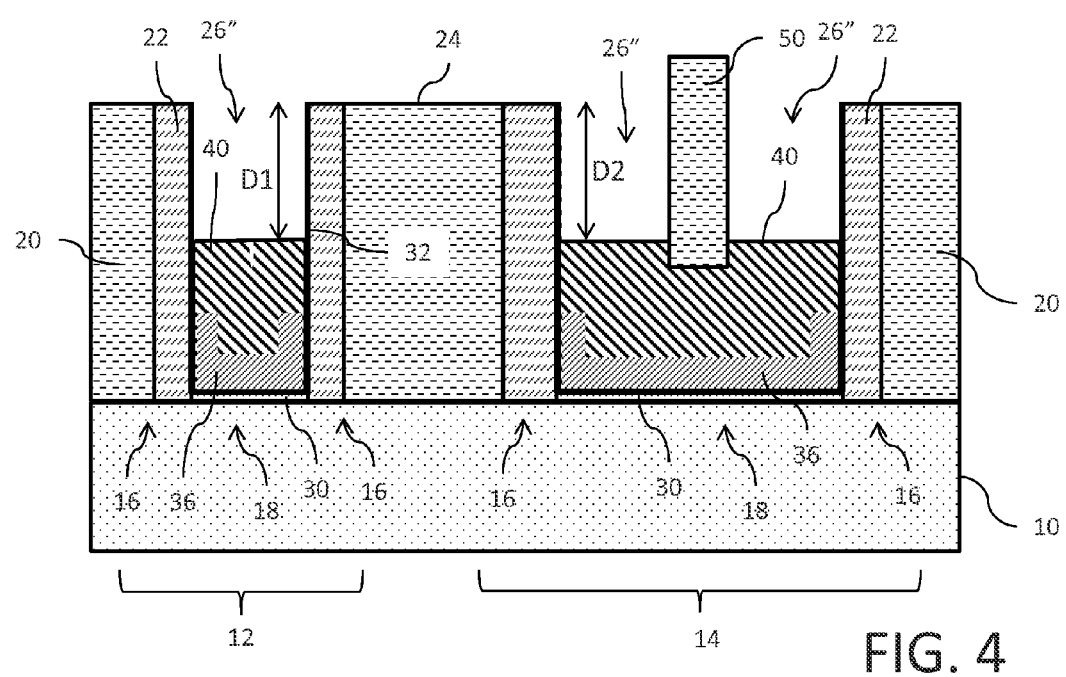

Reference is now made to FIG. 4. A process is then performed to recess the tungsten deposit 40. The recess process may comprise, for example, a dry etch process based on, for example, boron trichloride ($BCl_3$). Because the tungsten deposit 40 has a width L1 in the region 12 which is substantially equal to the thickness T2 on either side of the oxide material 50 in the region 14, the recess etching process will similarly attack the tungsten in the openings 26 fir regions 12 and 14 and thus effectuate a removal of the tungsten deposit 40 in both regions 12 and 14 to a substantially same depth D1 and D2, respectively. This recess operation leaves openings 26" in the regions 12 and 14.

The recess operation preferably does not reach a depth lower than the bottom of the oxide material 50. This configuration provides a first sub-region of tungsten on one side of the oxide material 50 and a second sub-region of tungsten on the other side of the oxide material. In other words, the first and second sub-regions at a top portion of the recessed tungsten deposit are separated from each other by a lower portion of the oxide material 50.

Figure 5:
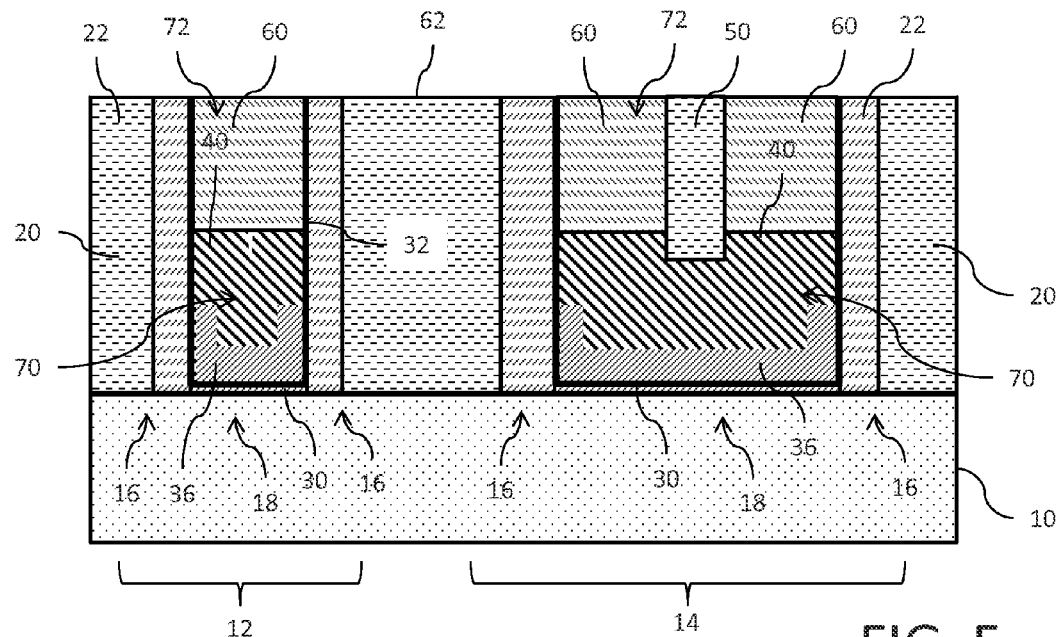

Reference is now made to FIG. 5. The openings 26" in the regions 12 and 14 are then filled with an insulating material 60. An ALD or CVD process may be used to make the deposit. The insulating material 60 may, for example, comprise silicon nitride (SiN). The filling of the openings 26" may result in material 60 deposited on top of the dielectric insulating layer 20, sidewall spacers 22 and oxide material 50. A process to remove the excess material and planarize the top surface 62 is performed. This process may comprise, for example, a chemical-mechanical polishing (CMP) operation.

In the FIG. 5 configuration, an upper surface is of the oxide material 50 is coplanar with the surface 42. Thus, the insulating material 60 is formed on either side of the oxide material. In other words, the insulating material includes a first portion and second portion separated from each other by the oxide material 50.

The combination of the work function metal (WFM) 36 and the recessed tungsten deposit 40 defines a metal gate electrode 70 for each transistor. The filling insulating material 60 forms a gate cap structure 72 for the gate stack whose sidewalls are protected by the sidewall spacers 22. Advantageously, the thickness of the tungsten material portion of the metal gate electrode is substantially equal regardless of differences in transistor channel length.

The process for integrated circuit fabrication then proceeds in a manner well known to those skilled in the art to provide electrical contacts to the gate, source and drain electrodes and further provide interconnecting metallization layers above the top surface 62.

Reference is now made to FIGS. 1-3 and 6-8 showing process steps for fabricating an integrated circuit. The description of FIGS. 1-3 will not be repeated here, see the discussion above incorporated herein by reference.

Figure 6:
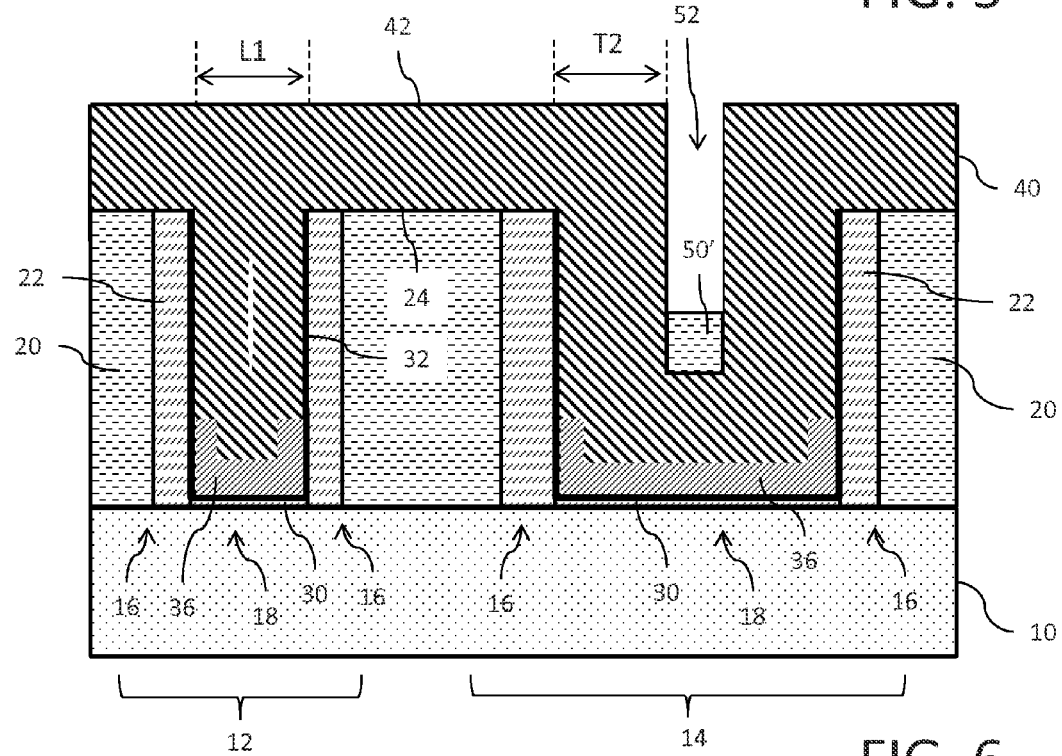

Following the filling of the opening 26' in the region 14 with the oxide material 50 (see, FIG. 3), a process is then performed to recess the oxide material 50. The recess process may comprise, for example, a dry etch process using chemical oxide removal (COR) or SiConi etch as known to those skilled in the art. The result of the recess is shown in FIG. 6, wherein it will be noted that a portion 50' of the oxide material 50 remains. This recess operation leaves an opening 52 in the region 14 which exposes side walls of the conformally deposited tungsten deposit 40.

Figure 7:
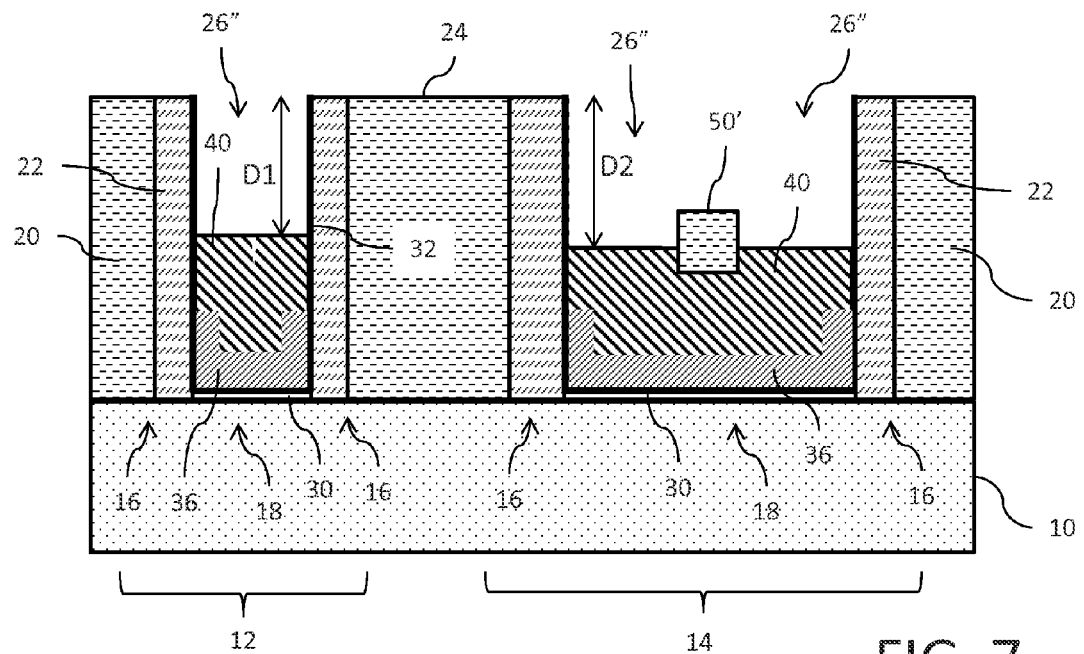

Reference is now made to FIG. 7. A process is then performed to recess the tungsten deposit 40. The recess process may comprise, for example, a dry etch process based on, for example, boron trichloride ($BCl_3$). Because the tungsten deposit 40 has a width T2 in the region 12 which is substantially equal to the thickness T3 in the region 14, the recess process will similarly attack the tungsten in the openings 26 for regions 12 and 14 and thus effectuate a removal of the tungsten deposit 40 in regions 12 and 14 to a substantially same depth D1 and D2, respectively. However, because the side walls of the conformally deposited tungsten deposit 40 in region 14 are also exposed (see FIG. 6), there is a possibility that the depth D2 of tungsten deposit 40 recess in region 14 may slightly exceed the depth D1 of tungsten deposit 40 recess in region 12 (i.e., it is possible that D2>D1). This recess operation leaves openings 26" in the regions 12 and 14.

Figure 8:
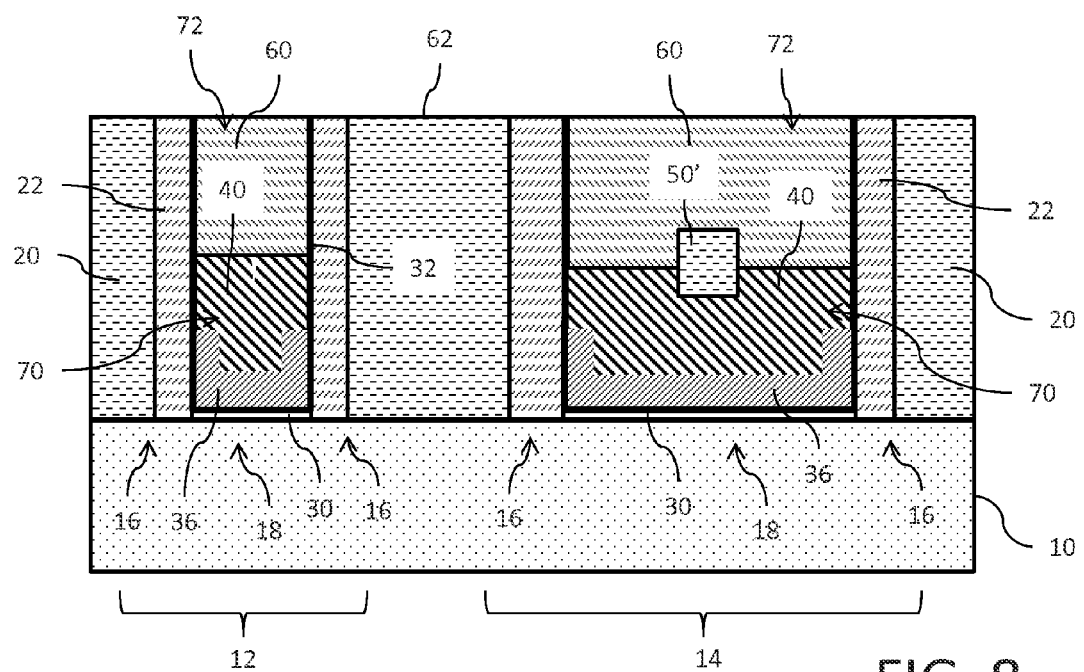

Reference is now made to FIG. 8. The openings 26" in the regions 12 and 14 are then filled with an insulating material 60. The deposition process may, for example, comprise CVD or ALD. The insulating material 60 may, for example, comprise silicon nitride (SiN). The filling of the openings 26" may result in material 60 deposited on top of the dielectric insulating layer 20 and sidewall spacers 22. A process to remove the excess material and planarize the top surface 62 is performed. This process may comprise, for example, a chemical-mechanical polishing (CMP) operation.

In the FIG. 8 configuration, the insulating material completely covers (i.e., buries) the recessed oxide material portion 50'.

The combination of the work function metal (WFM) 36 and the recessed tungsten deposit 40 defines a metal gate electrode 70 for each transistor. The filling insulating material 60 forms a gate cap structure 72 for the gate stack whose sidewalls are protected by the sidewall spacers 22. Advantageously, the thickness of the tungsten material portion of the metal gate electrode is substantially equal regardless of differences in transistor channel length.

The process for integrated circuit fabrication then proceeds in a manner well known to those skilled in the art to provide electrical contacts to the gate, source and drain electrodes and further provide interconnecting metallization layers above the top surface 62.

Reference is now made to FIGS. 1-4 and 9-11 showing process steps for fabricating an integrated circuit. The description of FIGS. 1-4 will not be repeated here, see the discussion above incorporated herein by reference.

Figure 9:
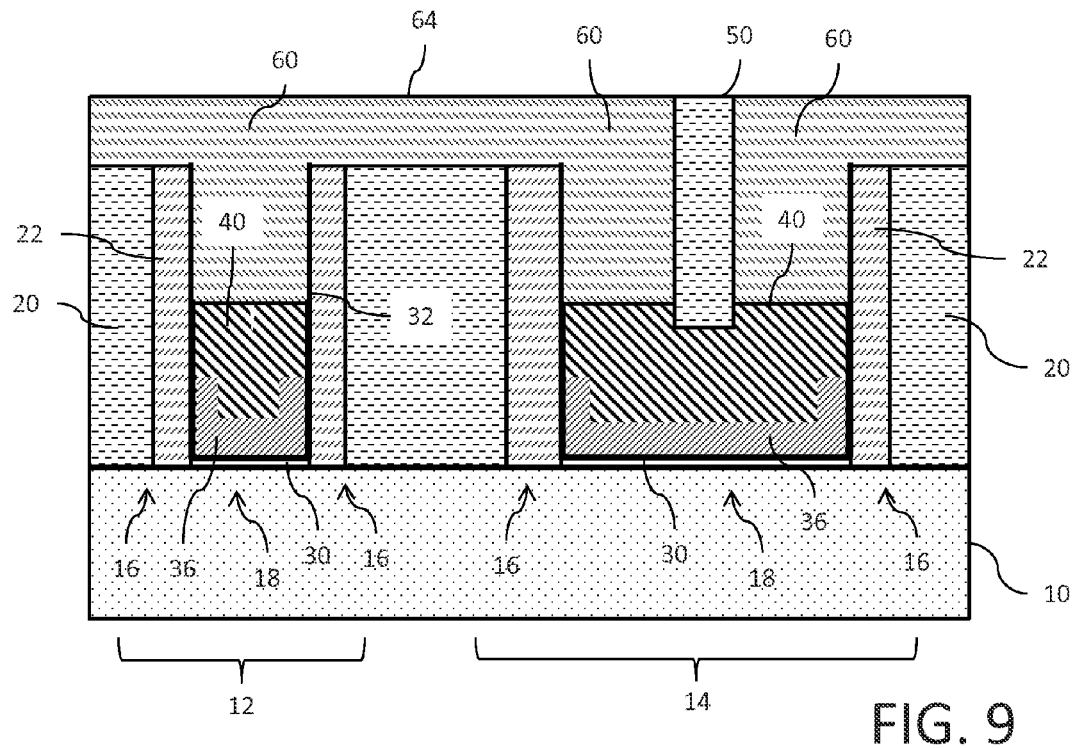

Reference is now made to FIG. 9. The openings 26" in the regions 12 and 14 are then filled with an insulating material 60. The deposition process may, for example, comprise CVD or ALD. The insulating material 60 may, for example, comprise silicon nitride (SiN). The filling of the openings 26" further covers the top surface of the dielectric insulating layer 20 and sidewall spacers 22, and further covers the oxide material 50. A process to remove the excess material and planarize the top surface 64 (coplanar with the oxide material 50) is performed. This process may comprise, for example, a chemical-mechanical polishing (CMP) operation.

Figure 10:
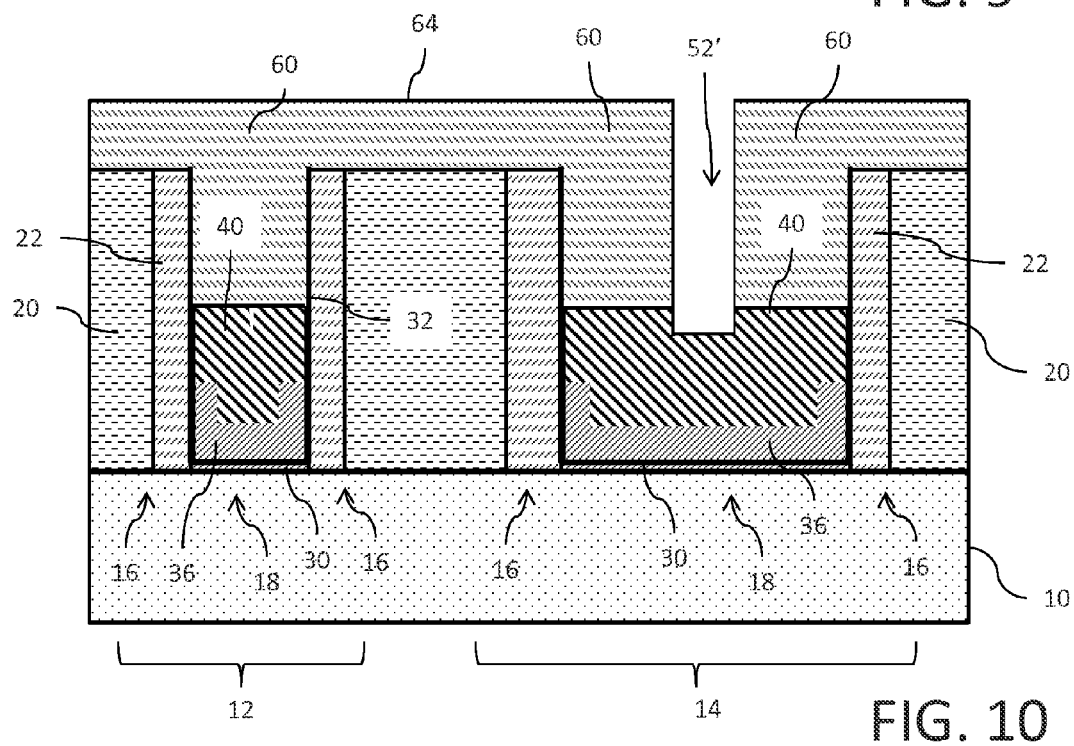

Reference is now made to FIG. 10. A process is then performed to recess the oxide material 50. The recess process may comprise, for example, a dry etch process using chemical oxide removal (COR) or SiConi etch as known to those skilled in the art. This recess operation preferably removes all of the material 50, thus leaving an opening 52' in the region 14.

Figure 11:
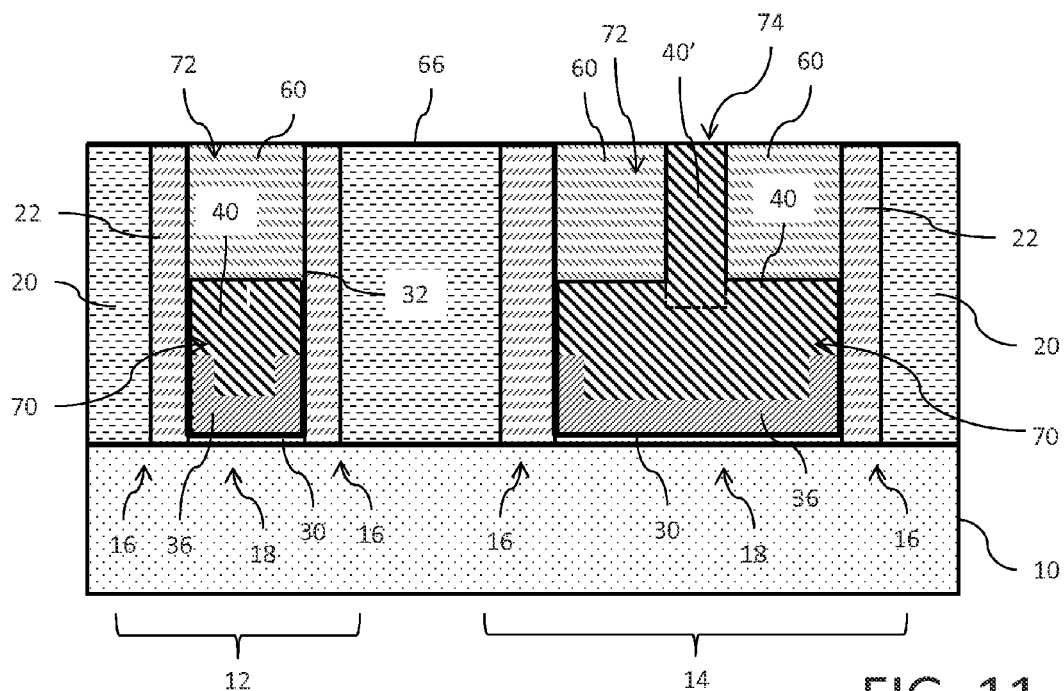

The opening 52' is then filled with a metal material 40'. In an embodiment, a CVD process is used to deposit the tungsten. The material 40' preferably comprises tungsten to match the metal deposit 40. The material 40' completely fills the opening 52' in the region 14. The filling of the opening 52' may result in material 40' deposited on top of the surface 64. A process to remove the excess material and planarize the top surface 66 is performed. This process may comprise, for example, a chemical-mechanical polishing (CMP) operation. The result is shown in FIG. 11.

The combination of the work function metal (WFM) 36 and the recessed tungsten deposit 40 defines a metal gate electrode 70 for each transistor. The filling insulating material 60 forms a gate cap structure 72 for the gate stack whose sidewalls are protected by the sidewall spacers 22. Advantageously, the thickness of the tungsten material portion 40 of the metal gate electrode is substantially equal regardless of differences in transistor channel length.

The process for integrated circuit fabrication then proceeds in a manner well known to those skilled in the art to provide electrical contacts to the gate, source and drain electrodes and further provide interconnecting metallization layers above the top surface 66. Indeed, the metal material 40' may in fact form the contact 74 for the metal gate electrode.

Reference is now made to FIGS. 1-4, 9-10 and 12 showing process steps for fabricating an integrated circuit. The description of FIGS. 1-4 and 9-10 will not be repeated here, see the discussion above incorporated herein by reference.

Figure 12:
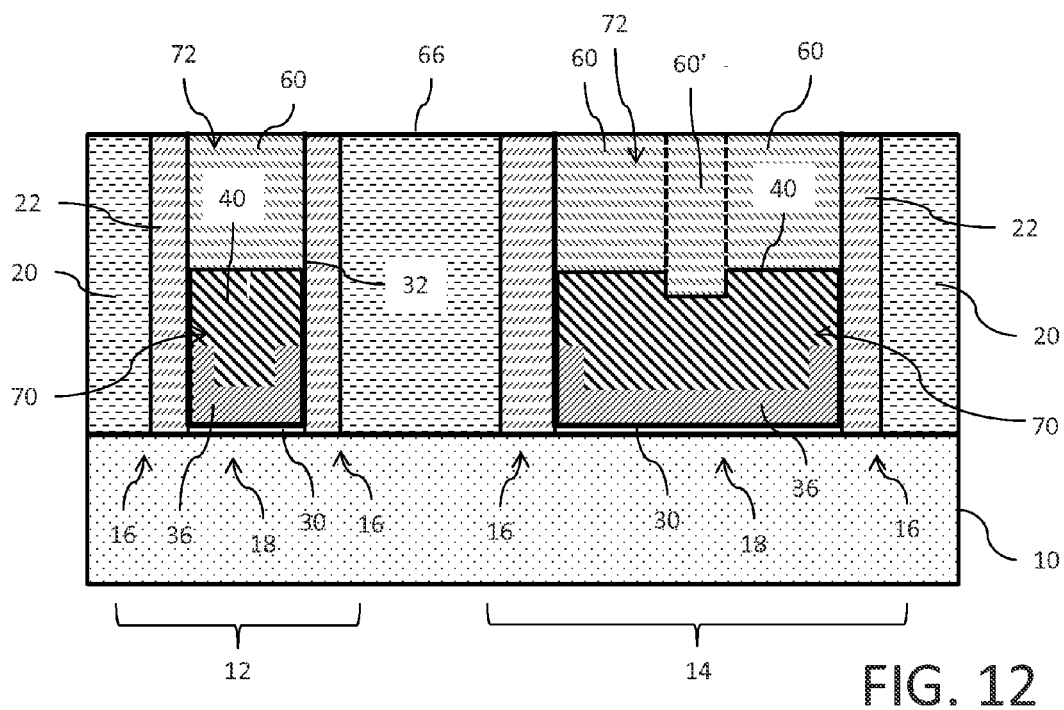

Reference is now made to FIG. 12. The opening 52' is this embodiment is instead filled with an insulating material 60'. A CVD or ALD process may be used for this deposition. The insulating material 60' may, for example, comprise silicon nitride (SiN) to match the material 60. The material 60' completely fills the opening 52' in the region 14. The filling of the opening 52' may result in material 60' deposited on top of the surface 64. A process to remove the excess material and planarize the top surface 66 is performed. This process may comprise, for example, a chemical-mechanical polishing (CMP) operation.

Because the tungsten recess operation preferably does not reach a depth lower than the bottom of the oxide material 50, a first sub-region of tungsten is provided on one side of the oxide material 50 and a second sub-region of tungsten is provided on the other side of the oxide material. In the FIG. 12 configuration, the insulating material 60' filling opening 52' has a lower portion that separates the first and second sub-regions at a top portion of the recessed tungsten deposit from each other.

The combination of the work function metal (WFM) 36 and the recessed tungsten deposit 40 defines a metal gate electrode 70 for each transistor. The filling insulating material 60 forms a gate cap structure 72 for the gate stack whose sidewalls are protected by the sidewall spacers 22. Advantageously, the thickness of the tungsten material portion of the metal gate electrode is substantially equal regardless of differences in transistor channel length.

The process for integrated circuit fabrication then proceeds in a manner well known to those skilled in the art to provide electrical contacts to the gate, source and drain electrodes and further provide interconnecting metallization layers above the top surface 66.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A process, comprising:
removing dummy gates from a pre-metal layer formed over a substrate to produce a first opening having a first length over a first channel region and produce a second opening having a second length longer than the first length over a second channel region;
depositing work function metal at a bottom of each of the first and second openings;
depositing an overlying metal layer on said pre-metal layer that fills the first opening and lines the second opening leaving a third opening;
depositing an insulating material in the third opening;
removing a portion of the overlying metal layer in said first opening to a first recessed depth from a top surface of said pre-metal layer; and
removing first and second portions of the overlying metal layer in said second opening on either side of the deposited insulating material to a second recessed depth from the top surface of said pre-metal layer;
wherein the first and second recesses depths are uniform.

2. The process of claim 1, wherein depositing the overlying metal layer comprises depositing the overlying metal layer with a thickness that is same as the first length of the first opening.

3. The process of claim 1, wherein a metal material of the overlying metal layer is tungsten.

4. The process of claim 1, wherein depositing work function metal comprises:
conformally depositing a layer of work function metal in the first and second openings; and
removing the work function metal layer from an upper portion of the sidewalls of the first and second openings.

5. A process, comprising:
removing dummy gates from a pre-metal layer formed over a substrate to produce a first opening having a first length over a first channel region and produce a second opening having a second length longer than the first length over a second channel region;
depositing work function metal at a bottom of each of the first and second openings;
depositing an overlying metal layer on said pre-metal layer that fills the first opening and lines the second opening leaving a third opening;
depositing an insulating material in the third opening; and
recessing the overlying metal layer to a same depth from a top surface of said pre-metal layer in each of the first and second openings, wherein recessing the overlying metal layer comprises:
forming a fourth opening in the overlying metal layer present in the first opening; and
forming fifth openings in the overlying metal layer present in the second opening on either side of the deposited insulating material.

6. The process of claim 5, further comprising filling the fourth and fifth openings with a dielectric material.

7. The process of claim 6, further comprising completely removing the insulating material within the third opening to form a sixth opening.

8. The process of claim 7, further comprising filling the sixth opening with a metal material.

9. The process of claim 7, further comprising filling the sixth opening with a dielectric material.

10. The process of claim 5, wherein depositing the overlying metal layer comprises depositing the overlying metal layer with a thickness that is same as the first length of the first opening.

11. The process of claim 5, wherein a metal material of the overlying metal layer is tungsten.

12. The process of claim 11, wherein recessing the overlying metal layer comprises performing a dry etch process to remove tungsten.

13. The process of claim 5, wherein depositing work function metal comprises:
conformally depositing a layer of work function metal in the first and second openings; and
removing the work function metal layer from an upper portion of the sidewalls of the first and second openings.

14. A process, comprising:
removing dummy gates from a pre-metal layer formed over a substrate to produce a first opening having a first length over a first channel region and produce a second opening having a second length longer than the first length over a second channel region;
depositing work function metal at a bottom of each of the first and second openings;
depositing an overlying metal layer on said pre-metal layer that completely fills the first opening and lines the second opening leaving a third opening;
depositing an insulating material in the third opening;
recessing the deposited insulating material to leave a reduced thickness insulating material portion in the third opening; and recessing the overlying metal layer to a same depth from a top surface of said pre-metal layer in each of the first and second openings after recessing the deposited insulating material.

15. The process of claim 14, wherein recessing the overlying metal layer comprises forming a fourth opening in the overlying metal layer present in the first opening and forming fifth openings in the overlying metal layer present in the second opening on either side of the reduced thickness insulating material portion.

16. The process of claim 15, further comprising filling the fourth and fifth openings with a dielectric material.

17. The process of claim 3, wherein recessing the overlying metal layer comprises performing a dry etch process to remove tungsten.

18. The process of claim 14, wherein depositing the overlying metal layer comprises depositing the overlying metal layer with a thickness that is same as the first length of the first opening.

19. The process of claim 14, wherein a metal material of the overlying metal layer is tungsten.

20. The process of claim 19, wherein recessing the overlying metal layer comprises performing a dry etch process to remove tungsten.

21. The process of claim 14, wherein depositing work function metal comprises:
conformally depositing a layer of work function metal in the first and second openings; and
removing the work function metal layer from an upper portion of the sidewalls of the first and second openings.

22. A process, comprising:
removing dummy gates from a pre-metal layer formed over a substrate to produce a first opening having a first length over a first channel region and produce a second opening having a second length longer than the first length over a second channel region;
depositing work function metal at a bottom of each of the first and second openings;
depositing a tungsten layer having a thickness on said pre-metal layer that is same as the first length, said tungsten layer filling the first opening and forming a tungsten liner in the second opening having a thickness that is same as the first length and leaving a third opening;
depositing an insulating material in the third opening; and
performing an operation to remove tungsten from both the first and second openings to substantially a same depth below a top surface of said pre-metal layer, wherein the operation to remove tungsten comprises:
forming a fourth opening in the tungsten present in the first opening; and
forming fifth openings in the tungsten present in the second opening on either side of the deposited insulating material.

23. The process of claim 22, further comprising filling the fourth and fifth openings with a dielectric material.

24. The process of claim 23, further comprising completely removing the insulating material within the third opening to form a sixth opening.

25. The process of claim 24, further comprising filling the sixth opening with tungsten.

26. The process of claim 24, further comprising filling the sixth opening with said dielectric material.

27. A process, comprising:
removing a first dummy gate from an insulating layer to form a first opening, said first opening located over a first channel region;
removing a second dummy gate from the insulating layer to form a second opening, said second opening located over a second channel region;
wherein a length of the first opening is less than a length of the second opening;
depositing a layer of metal on said insulating layer such that the layer of metal fills the first opening and further forms a metal liner along side walls of the second opening to form a third opening;
depositing an insulating material within the third opening to form a block of insulating material;
removing a first portion of the layer of metal in said first to leave a first metal portion over the first channel region; and
removing second portions of the layer of metal in said second opening on each side of the block of insulating material leave a second metal portion over the second channel region;
wherein a first distance from a top surface of the first metal portion to a top surface of the insulating layer after removing said first portion is same as a second distance from a top surface of the second metal portion to the top surface of the insulating layer after removing said second portions.

28. The process of claim 27, wherein a thickness of the metal liner along side walls of the second opening is substantially equal to the length of the first opening.

29. The process of claim 27, wherein said layer of metal is made of tungsten.

30. The process of claim 27, further comprising filling openings formed by removing the portion of the layer of metal with a dielectric material.

31. The process of claim 27, further comprising partially removing the insulating material within the third opening prior to removing the portion of the layer of metal.

32. The process of claim 31, further comprising filling openings formed by removing the portion of the layer of metal with a dielectric material.

33. The process of claim 27, further comprising:
filling openings formed by removing the portion of the layer of metal with a dielectric material; and
then completely removing the insulating material within the third opening.

34. The process of claim 33, further comprising filling an opening formed by completely removing the insulating material with a dielectric material.

35. The process of claim 33, further comprising filling an opening formed by completely removing the insulating material with a metal material.

* * * * *